(12) United States Patent
Cho

(10) Patent No.: US 9,479,146 B1
(45) Date of Patent: Oct. 25, 2016

(54) DATA OUTPUT DEVICE

(71) Applicant: SK hynix Inc., Icheon-si Gyeonggi-do (KR)

(72) Inventor: Yong Deok Cho, Yongin-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/873,295

(22) Filed: Oct. 2, 2015

(30) Foreign Application Priority Data

Jun. 16, 2015 (KR) .................. 10-2015-0085294

(51) Int. Cl.
*H03K 5/12* (2006.01)
*H03K 19/017* (2006.01)
*H03K 3/356* (2006.01)
*H03K 3/012* (2006.01)
*G11C 7/10* (2006.01)

(52) U.S. Cl.
CPC ....... *H03K 3/356113* (2013.01); *G11C 7/1051* (2013.01); *H03K 3/012* (2013.01)

(58) Field of Classification Search
USPC .................... 327/108–109, 112, 134, 170
See application file for complete search history.

(56) References Cited

U.S. PATENT DOCUMENTS

| | | | |
|---|---|---|---|
| 5,266,848 A | 11/1993 | Nakagome et al. | |
| 5,332,932 A * | 7/1994 | Runaldue | H03K 19/00361 326/33 |
| 6,163,178 A * | 12/2000 | Stark | G11C 7/1051 327/108 |
| 7,254,087 B2 | 8/2007 | Kim et al. | |
| 8,581,649 B2 * | 11/2013 | Nishio | H03K 19/00361 327/108 |

* cited by examiner

*Primary Examiner* — An Luu
(74) *Attorney, Agent, or Firm* — William Park & Associates Ltd.

(57) ABSTRACT

A data output device may include a driving control, a voltage supply unit, and an output driving unit. The driving control unit outputs a pull-up control signal and a pull-down control signal in response to a logic value of data when an output enable signal is activated. The voltage supply unit generates a driving voltage lower than a supply voltage. The output driving unit is driven in response to the driving voltage, and controls an amplitude and a slew rate of a voltage supplied to a global line according to the pull-up control signal and the pull-down control signal.

20 Claims, 7 Drawing Sheets

DATA OUTPUT DEVICE

CROSS-REFERENCES TO RELATED APPLICATION

The present application claims priority under 35 U.S.C. §119(a) to Korean application number 10-2015-0085294 filed on Jun. 16, 2015, in the Korean Intellectual Property Office, which is incorporated herein by reference in its entirety.

BACKGROUND

1. Technical Field

Various embodiments generally relate to an integrated circuit, more particularly to a data output device having a low-power characteristic.

2. Related Art

In general, a semiconductor memory device can be accessed in response to address and read/write command applied from a controller. Data stored in memory cells of the semiconductor memory device can be read in response to address signals and read commands, and data can be written to memory cells in response to address signals and write commands applied from the controller.

During a read operation of the semiconductor memory device, a low power data signal is outputted from the memory cell, and thus a sense amplifier is needed to sense the low power signal that represents a data bit stored in the memory cell.

The semiconductor memory device may include a plurality of banks, and each memory cell may belong to one of the plurality of banks. When a read operation is performed on a semiconductor memory device having a plurality of banks, the semiconductor memory device outputs data stored in memory cells through a global line coupled to a plurality of banks in common.

With decreasing power consumption in semiconductor memory devices, the operating voltages thereof continue to decrease. As a result, a low power data signal is outputted from the memory cells during a read operation, and thus a high-performance data output device is required. Manufacturers in the semiconductor industry have continually increased the density of the memory cells, which cause the semiconductor memory devices to consume more power, and thus the power consumption became an important issue for mobile devices using a battery.

Demands for high-performance mobile devices are leading to the efforts to develop low-power, high-performance, highly integrated semiconductor devices.

SUMMARY

Various embodiments are directed to a data output device capable of reducing current consumption during data transmission of a data bus in a device requiring low power consumption.

In an embodiment, a data output device may include: a driving control unit configured to output a pull-up control signal and a pull-down control signal in response to a logic value of data when an output enable signal is activated; a voltage supply unit configured to generate a driving voltage lower than a supply voltage; and an output driving unit configured to be driven in response to the driving voltage, and control an amplitude and a slew rate of a voltage supplied to a global line according to the pull-up control signal and the pull-down control signal.

According to the embodiments, it is possible to reduce a switching current of a data but, thereby implementing a device suitable for mobile products.

DETAILED DESCRIPTION

Hereinafter, a data output device will be described below with reference to the accompanying drawings through various examples of embodiments.

Figure 1:
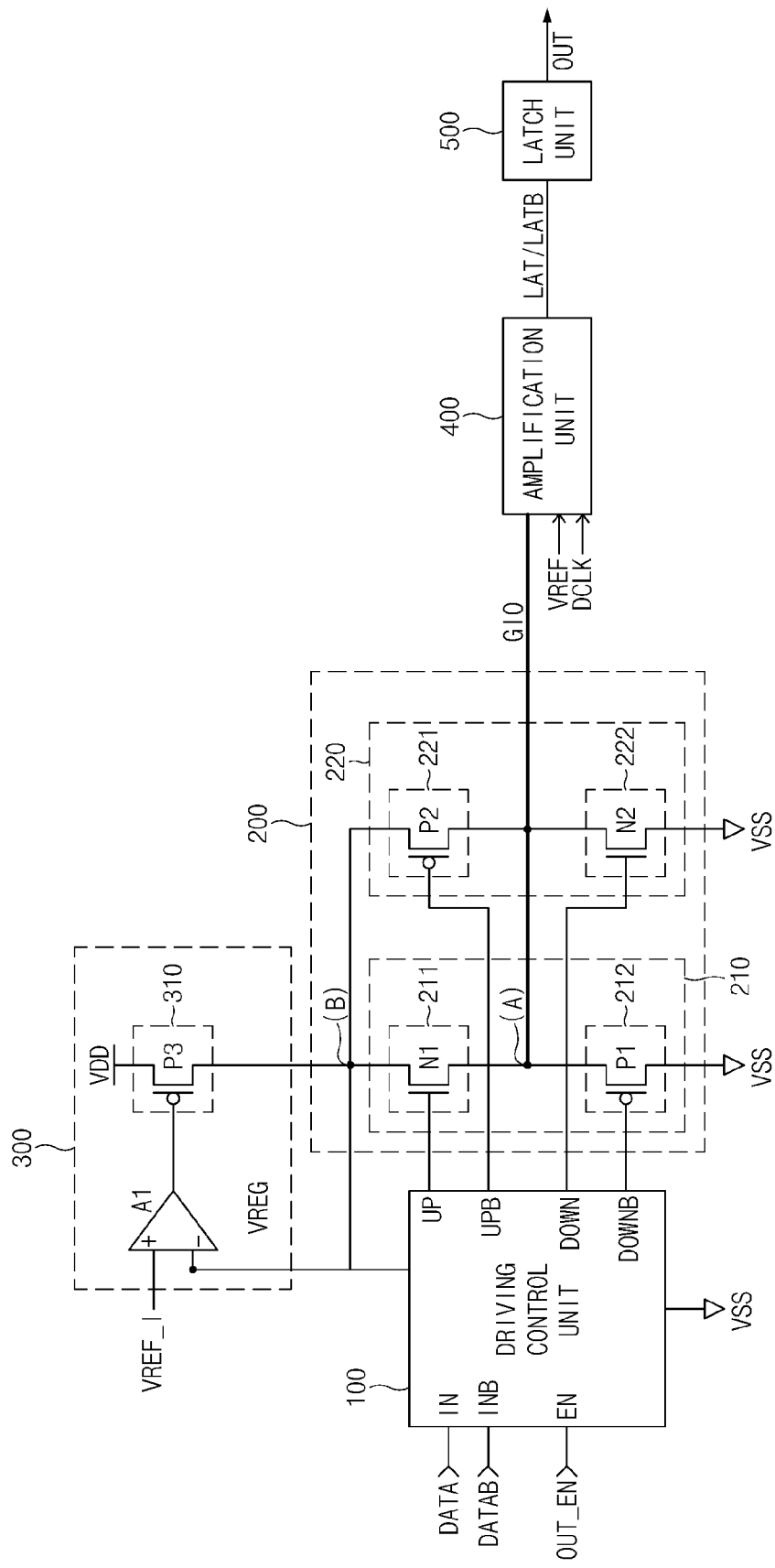
FIG. 1 is a configuration diagram of a semiconductor device in accordance with an embodiment.

FIG. 1 is a configuration diagram of a semiconductor device in accordance with an embodiment.

The semiconductor device may include a driving control unit 100, an output driving unit 200, a voltage supply unit 300, an amplification unit 400, and a latch unit 500.

The driving control unit 100 may generate pull-up control signals UP and UPB and pull-down control signals DOWN and DOWNB in response to data DATA and DATAB so that one of logic-high-level data and logic-low-level data may be transferred to a global line GIO. The driving control unit 100 may output the pull-up control signals UP and UPB and pull-down control signals DOWN and DOWNB in response to an output enable signal OUT_EN.

In an embodiment, the driving control unit 100 may drive the data DATA and DATAB using a driving voltage VREG, and output the pull-up control signals UP and UPB and the pull-down control signals DOWN and DOWNB, when an output enable signal OUT_EN is activated.

The pull-up control signal UPB may be obtained by inverting the pull-up control signal UP. Furthermore, the pull-down control signal DOWNB may be obtained by inverting the pull-down control signal DOWN. The pull-up control signals UP and UPB may be outputted in response to the data DATA, and the pull-down control signals DOWN and DOWNB may be outputted in response to the data DATAB. In an embodiment, the data DATA and DATAB may include data read from a semiconductor memory device or a device provided in a form of system on chip ("SoC").

The output driving unit 200 may pull-up drive the global line GIO to the level of the driving voltage VREG or pull-down drive the global line GIO to the level of a ground voltage VSS, and whether to pull-up or pull down the global line GIO mat be determined based on logic levels of the pull-up control signals UP and UPB and the pull-down control signal DOWN and DOWNB. The output driving unit 200 may include a 3-state driving unit.

The output driving unit 200 may include a driving unit 210 and a voltage control unit 220.

The driving unit 210 may adjust a swing width of a pull-up voltage and a pull-down voltage which are supplied to the global line GIO. For instance, the driving unit 210 may pull-up drive a node A to the level of the driving voltage VREF in response to the pull-up control signal UP, or pull-down drive the level of the ground voltage VSS in response to the pull-down control signal DOWNB.

The voltage control unit 220 may adjust slew rates of rising and falling edges of the pull-up voltage and the pull-down voltage being supplied to the global line GIO. The voltage control unit 220 may pull-up drive the node A to the level of the driving voltage VREG in response to the pull-up control signal UPB, or pull-down drive the node A to the level of the ground voltage VSS in response to the pull-down control signal DOWN.

The driving unit 210 may include a pull-up section 211 and a pull-down section 212.

The pull-up section 211 may include an NMOS transistor N1, which is coupled between the node A and an application terminal of the driving voltage VREG and receives the pull-up control signal UP through a gate terminal thereof. When the pull-up control signal UP is activated to a high level, the pull-up section 211 may pull-up drive the node A to the level of the driving voltage VREG.

The pull-up section 211 driven by a supply voltage VDD may cause the voltage of the global line GIO to vary because the level of the supply voltage VDD may vary according to the external environment. In an embodiment, however, the pull-up section 211 is driven by the driving voltage VREG, thereby ensuring a stable voltage level of the global line GIO.

The pull-down section 212 may include a PMOS transistor P1, coupled between the node A and a terminal to which the ground voltage VSS is applied. The PMOS transistor P1 may receive the pull-down control signal DOWNB through a gate terminal thereof. When the pull-down control signal DOWNB is activated to a low level, the pull-down section 212 may pull-down drive the node A to the level of the ground voltage VSS.

The voltage control unit 220 may include a pull-up control section 221 and a pull-down control section 222. The pull-up control section 221 and the pull-down control section 222 may include a weak transistor in terms of driving ability. For example, the pull-up control section 221 and the pull-down control section 222 may include a transistor which is small in size and has a narrow channel width.

The pull-up control section 221 may control a rising slew rate of the voltage applied to the global line GIO. The pull-up control section 221 may include a PMOS transistor P2, which is coupled between the node A and the application terminal of the driving voltage VREG and receives the pull-up control signal UPB through a gate terminal thereof. When the pull-up control signal UPB is activated to a low level, the pull-up control section 221 may pull-up drive the node A to the level of the driving voltage VREG. Thus, the pull-up control section 221 may control the rising slew rate of the pull-up voltage applied to the global line GIO.

The pull-down control section 222 may control a falling slew rate of the voltage applied to the global line GIO. The pull-down control section 222 may include an NMOS transistor N2, which is coupled between the node A and the application terminal of the ground voltage VSS and receives the pull-down control signal DOWN through a gate terminal thereof. When the pull-down control signal DOWN is activated to a high level, the pull-down control section 222 may pull-down drive the node A to the level of the ground voltage VSS. Thus, the pull-down control section 222 may control the falling slew rate of the pull-down voltage applied to the global line GIO.

The pull-up section 211 and the pull-down section 212 may operate complementarily to each other, and the pull-up control section 221 and the pull-down control section 222 may operate complementarily to each other. The pull-up section 211 and the pull-up control section 221 may operate in response to the pull-up control signals PU and PUB, and the pull-down section 212 and the pull-down control section 222 may operate in response to the pull-down control signals DOWN and DOWNB.

The voltage supply unit 300 may generate the driving voltage VREG by comparing the levels of a reference voltage VREF_I and the driving voltage VREG which is inputted as a feedback signal. The voltage supply unit 300 may include a voltage down converter ("VDC to step down a voltage level with which the output driving unit 200 is supplied.

Thus, the driving control unit 100 and the output driving unit 200 may operate by using the driving voltage VREG lower than the supply voltage VDD. The driving voltage VREG may be generated by being regulated in the voltage supply unit 300.

The voltage supply unit 300 may include a comparator A1 and a pull-up driving unit 310.

The comparator A1 may compare the voltage levels of the reference voltage VREF_I and the driving voltage VREG, and output the comparison result to the pull-up driving unit 310. The comparator A1 may receive the reference voltage VREF_I through a positive (+) terminal, and receive the driving voltage VREG through a negative (−) terminal.

The pull-up driving unit 310 may include a PMOS transistor P3 coupled between a node B and a terminal to which the supply voltage VDD is applied. The PMOS transistor P3 may receive the output of the comparator A1 through a gate terminal thereof. When the output of the comparator A1 is at a low level, the pull-up driving unit 310 may drive the supply voltage VDD, and output the driving voltage VREG to the node B. The driving voltage VREG may have a voltage level lower by the threshold voltage Vtn of the PMOS transistor P3 than the supply voltage VDD.

The amplification unit 400 may amplify the data of the global line GIO based on the level of the reference voltage VREF, and output the amplified data to the latch unit 500. The amplification unit 400 may operate in synchronization with a rising edge of a clock DCLK.

The latch unit 500 may store the output of the amplification unit 400 in response to the clock DCLK. The latch unit 500 may latch operate in synchronization with the clock DCLK, and output data OUT.

Figure 2:
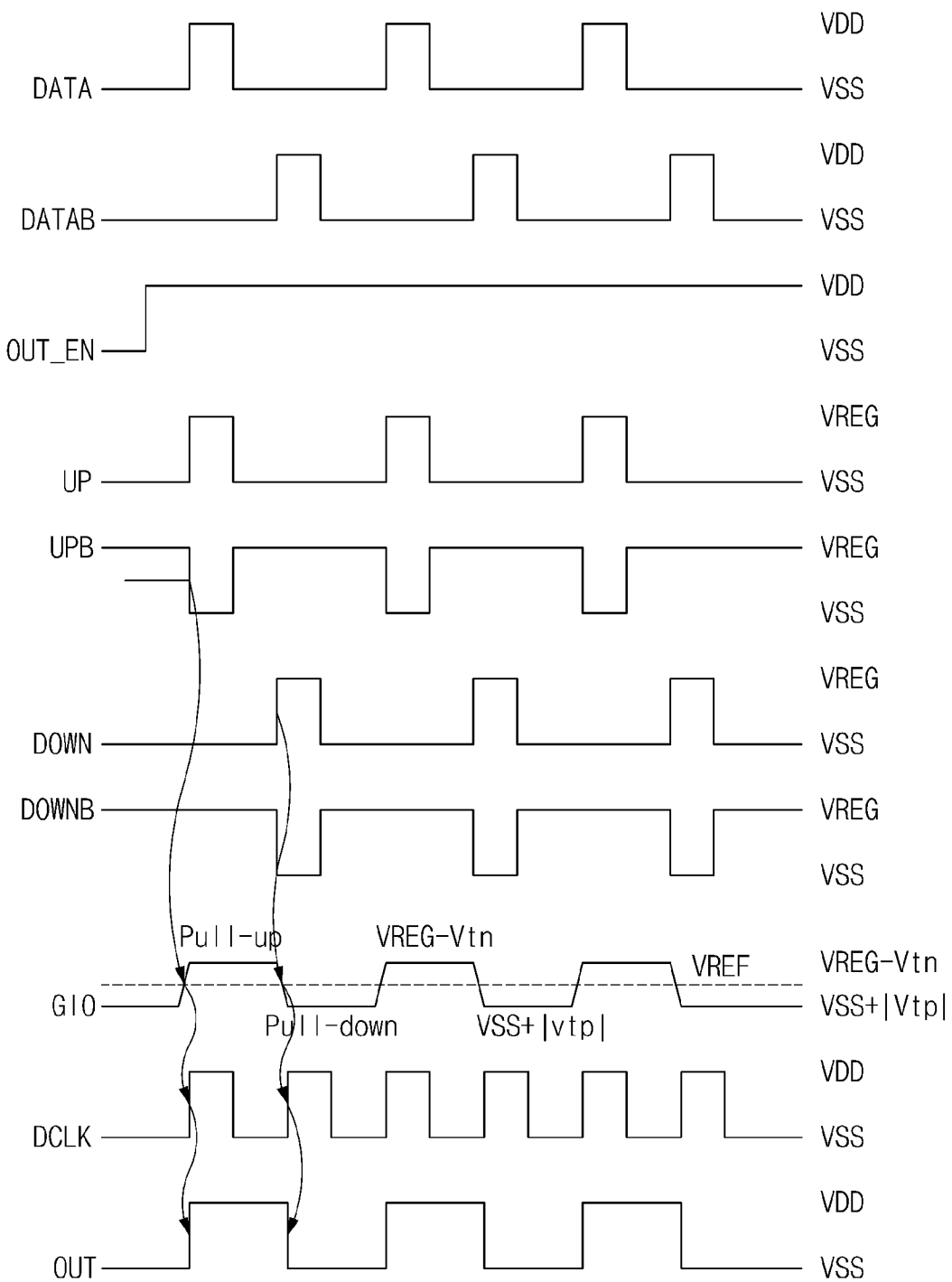
FIG. 2 is an operation timing diagram of the data output device of FIG. 1.

FIG. 2 is an operation timing diagram of the data output device of FIG. 1.

First, when the output enable signal OUT_EN is activated to a high level, the data DATA and DATAB may be inputted to the driving control unit 100. The data DATA and DATAB may be alternately activated to a high level with a predetermined time difference provided therebetween. Then, the driving control unit 100 may activate the pull-up control signal UP to a high level and activate the pull-up control signal UPB to a low level in response to the data DATA.

Then, the pull-up section 211 may be turned on in response to the pull-up control signal UP. When the NMOS transistor N1 is turned on, the global line GIO may be pull-up driven to a voltage level of VREG-Vtn which is lower by the threshold voltage Vtn of the NMOS transistor N1 than the driving voltage VREG.

Then, the pull-up control section 221 may be turned on in response to the pull-up control signal UPB. When the PMOS transistor P2 is turned on, the slew rate of a rising edge of the pull-up voltage applied to the global line GIO may be adjusted.

Then, the voltage of the global line GIO may be amplified by the amplification unit 400. The latch unit 500 may store the output of the amplification unit 400 in synchronization with the clock DCLK, and output the output data OUT.

Then, the driving control unit 100 may activate the pull-down control signal DOWN to a high level and the pull-down control signal DOWNB to a low level in response to the data DATAB.

Then, the pull-down section 212 may be turned on in response to the pull-down control signal UP. When the PMOS transistor P1 is turned on, the global line GIO may be pull-down driven to a voltage level of VSS+|Vtp| which is higher by the threshold voltage Vtp of the PMOS transistor P1 than the ground voltage VSS.

Then, the pull-down control section 222 may be turned on in response to the pull-down control signal DOWN. When the NMOS transistor N2 is turned on, the slew rate of a falling edge of the pull-down voltage applied to the global line GIO may be adjusted.

Then, the voltage of the global line GIO may be amplified by the amplification unit 400. The latch unit 500 may store the output of the amplification unit 400 in synchronization with the clock DCLK, and transmit the output data OUT.

Figure 3:
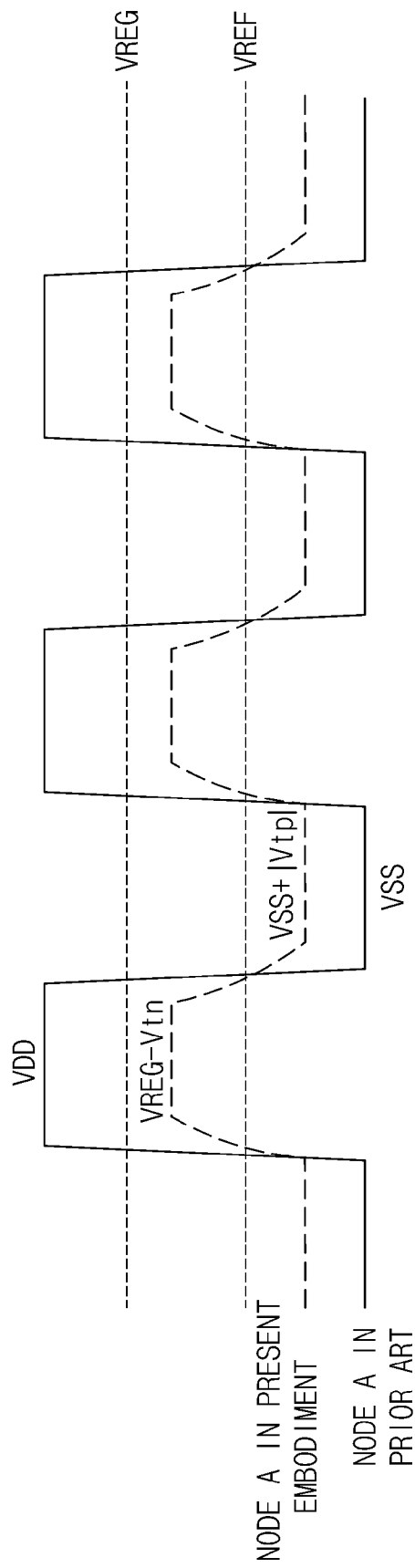
FIG. 3 is a diagram for describing the operation of an output driving unit of FIG. 1.

FIG. 3 is a diagram for describing the operation waveform of the node A in the output driving unit 200 of FIG. 1.

In some examples regarding data output device, the voltage level of the node A may be pull-up and pull-down driven by using the supply voltage level VDD and the ground voltage level VSS, which means that such a data output device has a large swing width, and thus may cause higher power consumption.

In an embodiment, however, the voltage VREG-Vtn lower than the supply voltage VDD and the voltage VSS+ |Vtp| higher than the ground voltage VSS may be applied to the output driving unit 200.

A data bus is one of the internal circuits that consume a large amount of power. In order to transmit and receive data at high speed, a large number of data buses are required. As the number of data buses increases, power consumption also increases.

A high-performance data output device requires a high bandwidth. An increasing bandwidth is ending up with an increase in the number of data buses. Thus, it is important to reduce power consumption during data transmission.

The power that is consumed at the data bus is proportional to the capacitance of the global line GIO, and proportional to the square of the supply voltage VDD. Thus, the power consumption at the data bus may be reduced by stepping down the supply voltage VDD.

In an embodiment, the amplitudes of the pull-up voltage and the pull-down voltage applied to the global line GIO may be adjusted by the driving unit 210. That is, the voltage applied to the global line GIO may be controlled to have the minimum amplitude through the operation of the driving unit 210. The slew rates of rising and falling edges may also be controlled by the voltage control unit 220 when the global line GIO is pull-up and pull-down driven.

Therefore, in an embodiment, power consumption can be reduced during the data transmission through the global line GIO.

Figure 4:
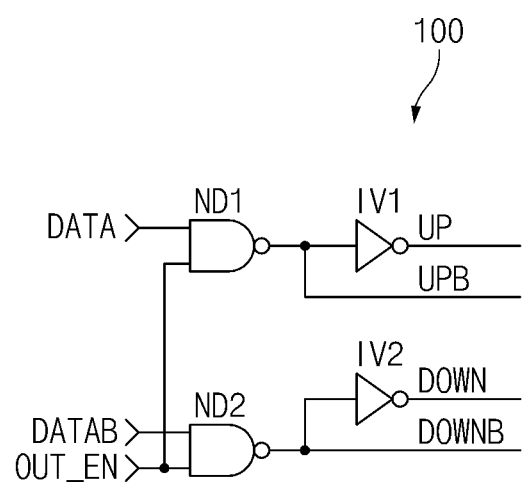
FIG. 4 is a detailed circuit diagram of a driving control unit 100 of FIG. 1.

FIG. 4 is a detailed circuit diagram of the driving control unit 100 of FIG. 1.

The driving control unit 100 may include NAND gates ND1 and ND2 and inverters IV1 and IV2.

The NAND gate ND1 may perform a NAND operation on the data DATA and the output enable signal OUT_EN, and output the pull-up control signal UPB. The inverter IV1 may invert the pull-up control signal UPB, and output the pull-up control signal UP.

The NAND gate ND2 may perform a NAND operation on the data DATAB and the output enable signal OUT_EN, and output the pull-down control signal DOWNB. The inverter IV2 may invert the output of the NAND gate ND2, and output the pull-down control signal DOWN.

The driving control unit 100 may control the global line GIO so that the global line GIO has one of a high and low level according to the values of the data DATA and DATAB, when the output enable signal OUT_EN is activated.

That is, when the data DATA is activated to a high level in case where the output enable signal OUT_EN is activated to a high level, the driving control unit 100 may output the pull-up control signal UP at a high level, and output the pull-up control signal UPB at a low level.

Furthermore, when the data DATAB is activated to a high level in case where the output enable signal OUT_EN is activated to a high level, the driving control unit 100 may output the pull-down control signal DOWN at a high level, and output the pull-down control signal DOWNB at a low level.

On the other hand, when the output enable signal OUT_EN is deactivated, the driving control unit 100 may output the pull-up control signal UPB and the pull-down control signal DOWNB at a high level, and output the pull-up control signal UP and the pull-down control signal DOWN at a low level. In this case, since all of the transistors of the output driving unit 200 are turned off, the output driving unit 200 may be deactivated.

Figure 5:
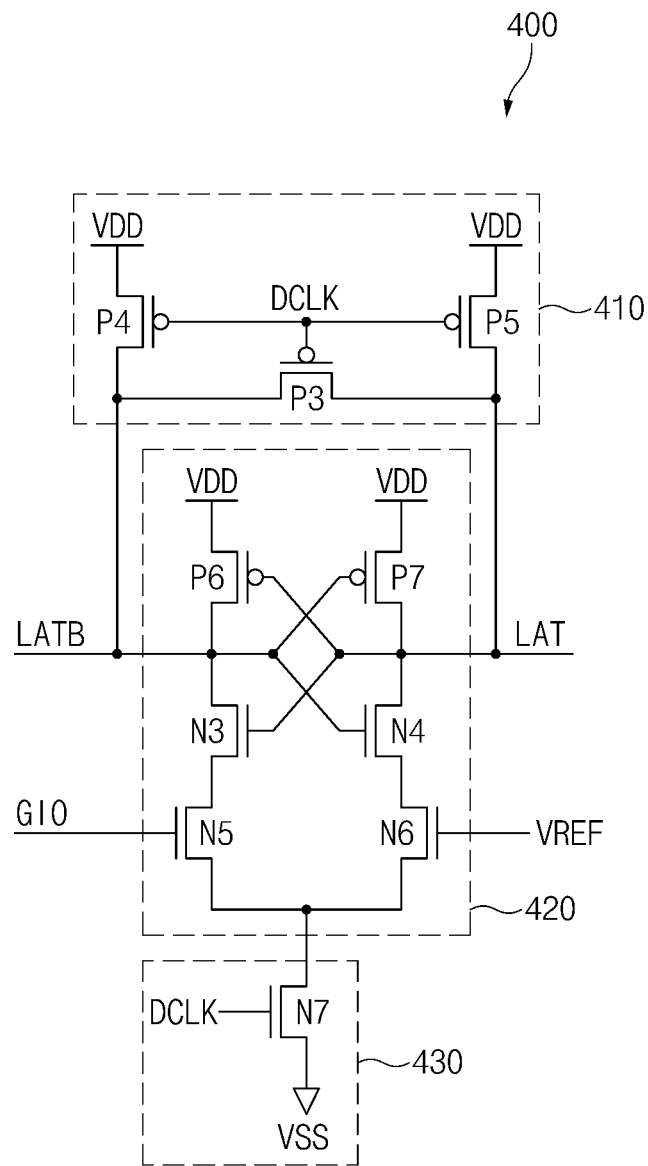
FIG. 5 is a detailed circuit diagram of an amplification unit of FIG. 1.

FIG. 5 is a detailed circuit diagram of the amplification unit 400 of FIG. 1.

The amplification unit 400 may include a precharge unit 410, a comparison unit 420, and an enable unit 430.

The precharge unit 410 may precharge a terminal, through which data LAT and LATB are transmitted, up to the supply voltage level VDD in response to the clock DCLK. When the clock DCLK is at a low level, the PMOS transistors P3 to P5 may be turned on, and the precharge unit 410 may precharge the data LAT and LATB to the supply voltage level VDD.

The precharge unit 410 may include the plurality of PMOS transistors P3 to P5. The gate terminals of the PMOS transistors P3 to P5 may be coupled in common to a terminal to which the clock DCLK is applied. The PMOS transistor P3 may be coupled between output terminals of the data LAT and LATB. The PMOS transistor P4 may be coupled between a terminal to which the supply voltage VDD is applied and the terminal through which the data LAT is transmitted, and the PMOS transistor P5 may be coupled between the terminal to which the supply voltage VDD is applied and the terminal through which the data LATB is transmitted.

The comparison unit 420 may compare the voltage of the global line GIO to the reference voltage VREF, and output the data LAT and LATB. The data LAT and the data LATB are differential data. When the clock DCLK is at a high level, the comparison unit 420 may perform a sensing and amplification operation, and output the data LAT and LATB at a low level.

When the voltage of the global line GIO is higher than the reference voltage VREF, the data LATB may transition to a low level. On the other hand, when the voltage of the global line GIO is higher than the reference voltage VREF, the data LAT may transition to a low level.

The comparison unit 420 may include a plurality of PMOS transistors P6 and P7 and a plurality of NMOS transistors N3 to N6.

The PMOS transistor P6 and the NMOS transistor N3 may be coupled in series between the application terminal of the supply voltage VDD and the NMOS transistor N5, and the common gate terminal thereof may be coupled to the terminal through which the data LAT is transmitted. The PMOS transistor P7 and the NMOS transistor N4 may be coupled in series between the application terminal of the supply voltage VDD and the NMOS transistor N6, and the common gate terminal thereof may be coupled to the terminal through which the data LATB is transmitted.

The NMOS transistor N5 may be coupled between the NMOS transistor N3 and the NMOS transistor N7 such that the gate terminal thereof is coupled to the global line GIO. The NMOS transistor N6 may be coupled between the NMOS transistor N4 and the NMOS transistor N7, and receive the reference voltage VREF through the gate terminal thereof.

The enable unit 430 may activate the amplification unit 400 in response to the clock DCLK. The enable unit 430 may include an NMOS transistor N7, which is coupled between the NMOS transistors N5 and N6 and the terminal to which the ground voltage VSS is applied and receives the clock DCLK through the gate terminal thereof. When the clock DCLK is at a high level, the enable unit 430 may be turned on to control the comparison unit 420 to perform a comparison operation.

Figure 6:
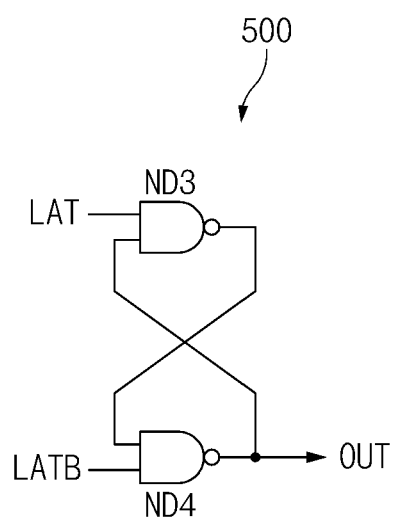
FIG. 6 is a detailed circuit diagram of a latch unit of FIG. 1.

FIG. 6 is a detailed circuit diagram of the latch unit 500 of FIG. 1.

The latch unit 500 may have an SR latch structure including a plurality of NAND gates ND3 and ND4. The latch unit 500 may store the data LAT and LATB outputted form the comparison unit 420, and transmit output data OUT. Since the data LAT and LATB are outputted as valid values only at a period in which the cock DCLK has a high-level pulse, the latch unit 500 may store the data LAT and LATB while the clock DCLK is at a low level.

Figure 7:
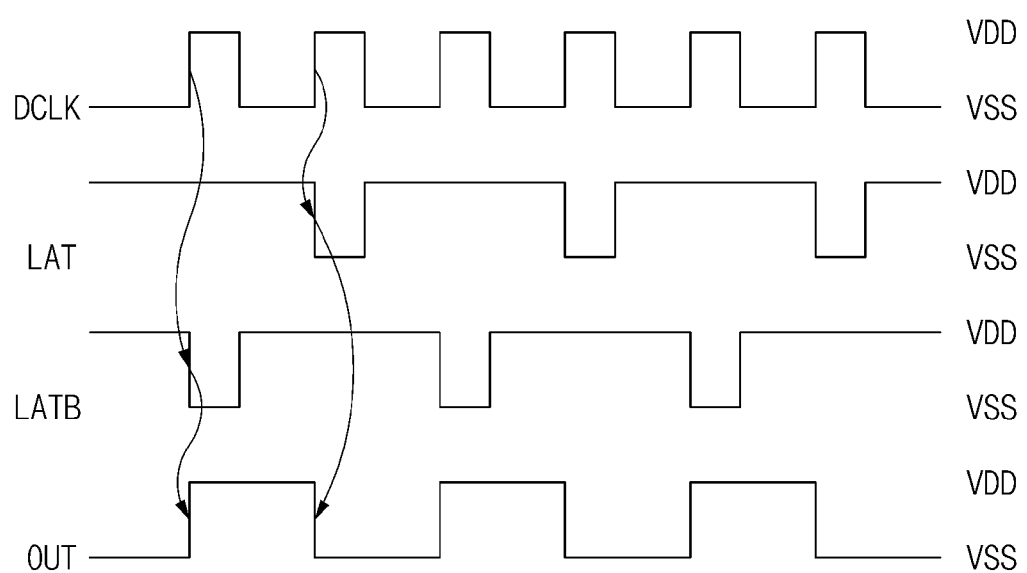
FIG. 7 is an operation timing diagram of the amplification unit of FIG. 5 and the latch unit of FIG. 6.

FIG. 7 is an operation timing diagram of the amplification unit 400 of FIG. 5 and the latch unit 500 of FIG. 6.

The amplification unit 400 may output the data LAT and LATB in synchronization with a rising edge of the clock DCLK. That is, whenever the clock DCLK transitions to a high level, the data LAT and LATB may be alternately activated to a low level.

The latch unit 500 may activate the output data OUT to a high level when the data LATB becomes a low level, and latch the activated data. Furthermore, the latch unit 500 may transition the data LAT to a low level at the point of time when the data LATB becomes a low level.

While various embodiments have been described above, it will be understood to those skilled in the art that the embodiments described are by way of example only. Accordingly, the data output device described herein should not be limited based on the described embodiments.

What is claimed is:

1. A data output device comprising:
   a driving control unit configured to output a pull-up control signal and a pull-down control signal in response to a logic value of data when an output enable signal is activated;
   a voltage supply unit configured to generate a driving voltage lower than a supply voltage; and
   an output driving unit configured to be driven in response to the driving voltage, and control an amplitude and a slew rate of a voltage supplied to a global line according to the pull-up control signal and the pull-down control signal.

2. The data output device of claim 1, wherein the driving control unit outputs first and second pull-up control signals having the opposite logic value to each other in response to first data, and outputs first and second pull-down control signals having the opposite logic value to each other in response to second data.

3. The data output device of claim 2, wherein the first and second data are alternately activated to a high level with a predetermined time difference provided therebetween.

4. The data output device of claim 2, wherein the driving control unit activates the first and second pull-up control signals when the first data is activated, and activates the first and second pull-down control signals when the second data is activated.

5. The data output device of claim 2, wherein the driving control unit comprises:
   a first NAND gate configured to perform a NAND operation on the output enable signal and the first data, and output the second pull-up control signal;
   a first inverter configured to invert the second pull-up control signal, and output the first pull-up control signal;
   a second NAND gate configured to perform a NAND operation on the output enable signal and the second data, and output the second pull-down control signal; and
   a second inverter configured to invert the second pull-down control signal, and output the first pull-down control signal.

6. The data output device of claim 1, wherein the voltage supply unit comprises a voltage down converter configured to generate the driving voltage by stepping down the supply voltage.

7. The data output device of claim 1, wherein the voltage supply unit comprises:
   a comparator configured to compare voltage levels of a reference voltage and the driving voltage inputted as a feedback signal; and
   a pull-up driving unit configured to generate the driving voltage by driving the supply voltage according to an output of the comparator.

8. The data output device of claim 7, wherein the pull-up driving unit comprises a first PMOS transistor coupled between a terminal to which the supply voltage is applied and a terminal to which the driving voltage is applied, wherein the first PMOS transistor is configured to receive an output of the comparator through a gate terminal thereof.

9. The data output device of claim 1, wherein the output driving unit comprises:
   a driving unit configured to control the amplitude of the voltage supplied to the global line according to the pull-up control signal and the pull-down control signal; and
   a voltage control unit configured to control the slew rate of the voltage supplied to the global line according to the pull-up control signal and the pull-down control signal.

10. The data output device of claim 9, wherein the driving unit supplies a voltage to the global line, the voltage being lower than the driving voltage and higher than a ground voltage.

11. The data output device of claim 9, wherein the driving unit comprises:
 a pull-up section configured to pull-up drive the global line according to a first pull-up control signal; and
 a pull-down section configured to pull-down drive the global line according to a first pull-down control signal.

12. The data output device of claim 11, wherein the pull-up section comprises a first NMOS transistor coupled between a terminal to which the driving voltage is applied and the global line, and configured to receive the first pull-up control signal through a gate terminal thereof, and wherein the pull-up section supplies a voltage to the global line, the voltage being lower by the threshold voltage of the first NMOS transistor than the driving voltage.

13. The data output device of claim 11, wherein the pull-down section comprises a second NMOS transistor coupled between a terminal to which a ground voltage is applied and the global line, and wherein the second NMOS transistor is configured to receive the first pull-down control signal through a gate terminal thereof, and wherein the pull-down section supplies a voltage to the global line, the voltage being higher by the threshold voltage of the second PMOS transistor than the ground voltage.

14. The data output device of claim 9, wherein the voltage control unit comprises:
 a pull-up control section configured to control a rising slew rate of the voltage applied to the global line according to a second pull-up control signal; and
 a pull-down control section configured to control a falling slew rate of the voltage applied to the global line according to a second pull-down control signal.

15. The data output device of claim 14, wherein the pull-up control section comprises a third PMOS transistor coupled between a terminal to which the driving voltage is applied and the global line, and wherein the third PMOS transistor is configured to receive the second pull-up control signal through a gate terminal thereof.

16. The data output device of claim 14, wherein the pull-down control section comprises a second NMOS transistor coupled between a terminal to which a ground voltage is applied and the global line, and wherein the second NMOS transistor is configured to receive the second pull-down control signal through a gate terminal thereof.

17. The data output device of claim 14, wherein the voltage control unit comprises a weak transistor having a narrower channel width than the transistors of the driving unit.

18. The data output device of claim 1, further comprising:
 an amplification unit configured to compare the voltage of the global line to the reference voltage, and amplify the voltage of the global line; and
 a latch unit configured to store an output of the amplification unit.

19. The data output device of claim 18, wherein the amplification unit alternately outputs first and second output data having a low level in synchronization with rising edges of a clock during an active period of the clock.

20. The data output device of claim 19, wherein the latch unit stores data from a point of time when the first output data is activated to a point of time when the second output data is activated.

* * * * *